United States Patent
Baillin (10) Patent No.: US 10,251,308 B2
(45) Date of Patent: Apr. 2, 2019

(54) COOLING DEVICE FOR ELECTRONIC COMPONENTS USING LIQUID COOLANT

(71) Applicant: Commissariat a l'energie atomique et aux energies alternatives, Paris (FR)

(72) Inventor: Xavier Baillin, Crolles (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 641 days.

(21) Appl. No.: 14/883,003

(22) Filed: Oct. 14, 2015

(65) Prior Publication Data
US 2016/0113152 A1    Apr. 21, 2016

(30) Foreign Application Priority Data
Oct. 17, 2014 (FR) .................................. 14 60022

(51) Int. Cl.
*H05K 7/20* (2006.01)
*F04B 43/04* (2006.01)
(Continued)

(52) U.S. Cl.
CPC .......... *H05K 7/20272* (2013.01); *B23P 15/26* (2013.01); *F04B 43/043* (2013.01);
(Continued)

(58) Field of Classification Search
CPC ... H05K 7/20272; B23P 15/26; F04B 43/043; F04B 43/046; H01L 23/473; H01L 2924/0002; H01L 23/3677; H01L 23/3738
See application file for complete search history.

(56) References Cited

U.S. PATENT DOCUMENTS 3,310,716 A * 3/1967 Emeis .................. H01L 23/051
                                                          174/541
3,585,713 A * 6/1971 Kaneda et al. ......... H01L 21/00
                                                          257/763
(Continued)

FOREIGN PATENT DOCUMENTS

DE    10 2009 013 913 A1    9/2010
EP     0 134 614 A1    3/1985
(Continued)

OTHER PUBLICATIONS

U.S. Appl. No. 12/494,123, filed Jun. 29, 2009, 2010/0003789 A1, Stephane Caplet, et al.
(Continued)

*Primary Examiner* — Claire Rojohn, III
(74) *Attorney, Agent, or Firm* — Oblon, McClelland, Maier & Neustadt, L.L.P.

(57) ABSTRACT

A device used for cooling a component including a support to receive a component to be cooled, is provided. The support includes a fluid network in which a liquid will circulate. The network includes a first cavity, a second cavity, and a first channel connecting the first cavity to the second cavity, a first deformable membrane and a second deformable membrane forming a mobile wall of the first cavity and a mobile wall of the second cavity respectively. The device further an actuation device for actuating the first membrane and the second membrane, the actuating device including a fixed electrode located on one or several protuberances of the support.

17 Claims, 8 Drawing Sheets

(51) Int. Cl.
*H01L 23/473* (2006.01)
*B23P 15/26* (2006.01)
*H01L 23/367* (2006.01)
*H01L 23/373* (2006.01)

(52) U.S. Cl.
CPC .......... *F04B 43/046* (2013.01); *H01L 23/473* (2013.01); *H01L 23/3677* (2013.01); *H01L 23/3738* (2013.01); *H01L 2924/0002* (2013.01)

(56) References Cited

U.S. PATENT DOCUMENTS

| | | | | |
|---|---|---|---|---|
| 3,691,627 | A * | 9/1972 | Engeler | H01L 21/00 148/DIG. 30 |
| 4,508,402 | A * | 4/1985 | Tomino | H05K 1/189 345/169 |
| 4,895,500 | A * | 1/1990 | Hok | F04B 43/043 137/512.4 |
| 4,902,278 | A * | 2/1990 | Maget | A61M 5/155 128/DIG. 12 |
| 4,905,072 | A * | 2/1990 | Komatsu | H01L 21/30604 257/64 |
| 5,145,552 | A * | 9/1992 | Yoshizawa | H01L 21/486 216/18 |
| 5,171,132 | A * | 12/1992 | Miyazaki | F04B 43/046 417/322 |
| 5,186,001 | A * | 2/1993 | Muntz | F01B 29/00 60/508 |
| 5,367,878 | A * | 11/1994 | Muntz | F01B 29/00 200/83 N |
| 7,265,477 | B2 | 9/2007 | Wan | |
| 7,348,665 | B2 | 3/2008 | Sauciuc et al. | |
| 7,517,440 | B2 * | 4/2009 | Anex | A61M 5/14248 137/1 |
| 8,048,766 | B2 * | 11/2011 | Joly | B81C 1/00253 257/531 |
| 8,422,142 | B2 * | 4/2013 | Bolis | G02B 3/14 359/665 |
| 8,542,445 | B2 * | 9/2013 | Bolis | G02B 3/14 359/665 |
| 8,708,441 | B2 * | 4/2014 | Hoisington | B41J 2/04581 347/10 |
| 8,991,954 | B2 * | 3/2015 | Govyadinov | B41J 2/14233 347/6 |
| 9,901,014 | B2 * | 2/2018 | Robert | H05K 7/20872 |
| 2002/0097303 | A1 * | 7/2002 | Gulvin | B41J 2/14314 347/65 |
| 2002/0184907 | A1 * | 12/2002 | Vaiyapuri | F04B 43/046 62/259.2 |
| 2003/0085024 | A1 * | 5/2003 | Santiago | B01D 19/0031 165/104.11 |
| 2004/0130874 | A1 * | 7/2004 | Maveety | H01L 23/42 361/699 |
| 2005/0056934 | A1 * | 3/2005 | Suzawa | C23F 4/00 257/741 |
| 2006/0050493 | A1 * | 3/2006 | Hamasaki | G02B 6/4201 361/767 |
| 2008/0135216 | A1 * | 6/2008 | Zhang | H01L 23/473 165/104.33 |
| 2008/0180923 | A1 * | 7/2008 | Grespan | H01L 23/04 361/748 |
| 2008/0283224 | A1 * | 11/2008 | Ma | F04B 43/04 165/104.31 |
| 2010/0001361 | A1 * | 1/2010 | Caplet | B81B 7/0038 257/467 |
| 2010/0003789 | A1 * | 1/2010 | Caplet | B81C 1/00285 438/124 |
| 2012/0052313 | A1 * | 3/2012 | Sibuet | B81C 3/001 428/457 |
| 2012/0328779 | A1 * | 12/2012 | Caplet | B81B 7/0038 427/245 |
| 2013/0207281 | A1 * | 8/2013 | Baillin | B81B 7/0038 257/787 |
| 2014/0145302 | A1 * | 5/2014 | Hong | H01L 23/5223 257/532 |
| 2015/0028433 | A1 * | 1/2015 | Baillin | B81B 7/0038 257/415 |
| 2015/0151959 | A1 * | 6/2015 | Baillin | B81B 7/0038 257/787 |
| 2015/0243594 | A1 * | 8/2015 | Baillin | H01L 21/76898 257/507 |
| 2016/0113152 | A1 * | 4/2016 | Baillin | F04B 43/043 165/80.4 |
| 2017/0362127 | A1 * | 12/2017 | Takeuchi | F04B 43/046 |

FOREIGN PATENT DOCUMENTS

| | | |
|---|---|---|
| EP | 2 407 416 A1 | 1/2012 |
| WO | WO 2005/060593 A2 | 7/2005 |
| WO | WO 2009/010562 A1 | 1/2009 |

OTHER PUBLICATIONS

U.S. Appl. No. 12/494,147, filed Jun. 29, 2009, 2010/0001361 A1, Stephane Caplet, et al.
U.S. Appl. No. 13/218,763, filed Aug. 26, 2011, 2012, 0052313 A1, Henri Sibuet, et al.
U.S. Appl. No. 13/530,513, filed Jun. 22, 2012, 2012/0328779 A1, Stephane Caplet, et al.
U.S. Appl. No. 13/764,244, filed Feb. 11, 2013, 2013/0207281 A1, Xavier Baillin, et al.
U.S. Appl. No. 14/331,285, filed Jul. 15, 2014, 2015/0028433 A1, Xavier Baillin, et al.
U.S. Appl. No. 14/555,913, filed Nov. 28, 2014, 2015/0151959 A1, Xavier Baillin.
U.S. Appl. No. 14/408,478, filed Jun. 25, 2013, 2015/0243594 A1, Xavier Baillin, et al.
U.S. Appl. No. 14/725,028, filed May 29, 2013, Xavier Baillin.
U.S. Appl. No. 14/857,047, filed Sep. 17, 2015, Xavier Baillin.
French Preliminary Search Report dated Jul. 3, 2015 in French Application 14 60022, filed on Oct. 17, 2014 (with Translation of Categories of Cited Documents).

* cited by examiner

COOLING DEVICE FOR ELECTRONIC COMPONENTS USING LIQUID COOLANT

TECHNICAL DOMAIN AND PRIOR ART

This invention relates to the field of electronic components and particularly microelectronic devices and microsystems and more particularly component cooling structures using a liquid coolant.

As a result of the increasing integration density of components within microelectronic devices, these devices are increasingly subject to heating problems.

A solution to prevent overheating of a device on which electronic components are installed consists of placing a chamber adjacent to it in which a liquid coolant circulates.

The liquid coolant may be circulated using an actuation means fitted with a motor, for example as described in document US 2008/0135216 A.

Another solution for controlling the temperature of a microelectronic component consists of using a fluid network in which a pump is used to circulate the liquid coolant.

Such cooling systems with a pump or motor are complex to manufacture.

As a variant, it is possible to provide an electrostatic or piezoelectric actuator for the fluid.

The problem arises of finding a new cooling device using a liquid coolant, particularly to provide improved cooling.

DESCRIPTION OF THE INVENTION

One embodiment of this invention discloses a device comprising:
- a support, that will receive or that comprises at least one component to be cooled, the support comprising a fluid network inside which a liquid may circulate, the network comprising a first cavity, a second cavity and at least one first channel connecting the first cavity to the second cavity, a first deformable membrane and a second deformable membrane, the first membrane and the second membrane forming a mobile wall of the first cavity and a mobile wall of the second cavity respectively, the device further comprising:
- actuation means for actuating the first membrane and the second membrane, the actuation means being configured to enable deformation of the first and/or the second membrane.

The actuation may comprise electrodes and a biasing circuit.

The component to be cooled may be an electronic component such as an integrated circuit chip and/or an electromechanical component such as an electromechanical microsystem.

By deforming the first membrane, the volume of the first cavity is modulated, while by deforming the second membrane, the volume of the second cavity is varied. A variation in the volume of the first cavity and/or of the second cavity can enable displacement of liquid in the channel.

Such a device is easier to implement than a device fitted with a pump or a motor.

Such a device enables easier circulation of the liquid coolant and thus improved cooling.

Advantageously, the device further comprises a thermal conducting element close to the channel or in contact with the channel, the thermal conducting element passing through the support and having a higher thermal conductivity than the thermal conductivity of the support.

This thus improves heat dissipation.

The thermal conducting element may be connected to a conducting zone located on a face of the support opposite another face on which the component will be located.

This gives a better distribution of the heat dissipation.

Actuation means may be provided such that the first and the second membrane may be actuated independently of each other. Independently means that the membranes may be deformed simultaneously or successively, and that their deformations may be different from each other.

According to one particular embodiment of the actuation means, these actuation means may be configured to alternately:
- displace the first membrane so as to reduce the volume of the first cavity, then
- displace the second membrane of the second cavity so as to reduce the volume of the second cavity.

This thus implements a to and fro movement of the liquid in the channel and improves heat dissipation.

Actuation means may be configured to alternately:
- apply a stress on the first membrane while the second membrane is not stressed by the actuation means;
- apply a stress on the second membrane while the first membrane is not stressed by the actuation means.

Therefore in this case, during a first phase, the first membrane is actuated by actuation means that can cause displacement of liquid in the channel, this displacement causing a displacement of the second membrane that is then not subjected to a stress by the actuation means, then during a second phase, actuation of the second membrane that can cause displacement of the liquid in the inverse direction in the channel, this displacement of liquid causing a displacement of the first membrane that is then not stressed by the actuation means.

In this case, during the first phase, there is an active actuation on the first membrane and a passive actuation of the second membrane, and during the second phase, there is an active actuation on the second membrane and a passive actuation of the first membrane.

As a variant, the actuation means may be configured to:
- jointly with displacement of the first membrane so as to reduce the volume of the first cavity, displace the second membrane so as to increase the volume of the second cavity, then
- jointly with displacement of the second membrane so as to reduce the volume of the second cavity, displace the first membrane of the first cavity so as to increase the volume of the first cavity.

In this case, during the first phase, there is active actuation on the first and second membranes, and during the second phase there is active actuation on the first and second membranes.

According to one possible embodiment, the membrane actuation means may be of the piezoelectric and/or electrostatic type.

According to one embodiment of the actuation means, these actuation means comprise:
- at least one first electrode located on or integrated into the first membrane,
- at least one second electrode located on or integrated into the second membrane.

According to one particular embodiment, the actuation means may also comprise at least one fixed electrode integrated into the support and located facing the first electrode and/or the second electrode.

The fixed electrode can act as a counter electrode common to the first electrode and the second electrode. As a variant, the first electrode is associated with and is facing the fixed electrode, while another fixed electrode is associated with and is facing the second electrode.

Such a fixed electrode may be provided particularly when the first electrode and the second electrode are displaced by setting up an electrostatic attraction force.

According to one particular embodiment of the fixed electrode, the electrode may be placed on a protuberance facing the first electrode or the second electrode or each of these electrodes. Protuberances with different heights may be further provided. This makes it possible to apply reduced potential levels to the electrodes.

According to another particular embodiment of the fixed electrode, the fixed electrode may be placed on several protuberances facing the first electrode or the second electrode or each of these electrodes. This makes it possible to apply an improved and more efficient deformation on the membranes.

According to an advantageous embodiment, at least one groove is arranged between two of said protuberances, the groove extending in a direction parallel to the first channel. Thus, the grooves between protrusions may be arranged to facilitate the flow of fluid in the first cavity to the second channel or cavity of the second cavity to the first cavity.

In the case of a piezoelectric actuation, at least one of the first and second membranes may include a layer of piezoelectric material.

The actuation means may comprise polarising means or a biasing circuit of the first electrode and the second electrode. Advantageously, these biasing means are integrated into the support.

According to one possible embodiment, the actuation means may include biasing means or a biasing circuit configured to apply a first potential to the first electrode and a second potential to the second electrode, different from the first potential. Thus, the first electrode and the second electrode may be biased independently of each other.

According to one possible embodiment of the device, it may be provided with an electrical connection element passing through the support, this connecting element connecting a first face of the support on which the component will be located and a second face opposite the first face.

According to one possible embodiment of the fluid network, the network may be provided with one or several additional fluid channels and one or several additional cavities with deformable membranes facing the additional cavities.

According to one possible embodiment, the device may be provided with a means or a circuit for measuring the temperature of the component and a control means or a control circuit for the actuation means as a function of the temperature measured by the measurement means.

One embodiment of this invention includes a method of manufacturing a device as defined above.

One embodiment of this invention includes a method of manufacturing a device to cool a component comprising a step consisting of assembling a first substrate with a second substrate in which a fluid channel is at least partially made.

After assembly, membranes may be formed on the second substrate.

These membranes may be made starting from one or several thinned zones in the second substrate.

As a variant or in combination, these membranes may be formed by transferring at least one layer on the second substrate.

In this case, the membranes may close openings formed in the second substrate.

Thus, one embodiment of the invention comprises a method of making a device as defined above, comprising steps as follows:
assemble a first substrate with a second substrate, said at least one fluid channel and openings designed to form the first and the second cavity being at least partially made in the first and/or second substrate,
form membranes from one or several thinned zones of the second substrate and/or by transferring at least one layer on the second substrate so as to close the openings.

Before the openings are closed by the membranes, the method may include a step to fill said at least one channel and cavities by a liquid.

As a variant, the method may include a step to fill said at least one channel and cavities after the openings have been closed by the membranes, this step consisting of:
forming at least one vent in the second substrate or the first substrate such that said vent opens up in said at least one channel;
filling said at least one channel and the cavities with a liquid dispensed through said vent;
depositing a film to close off said at least one vent;

According to one particular embodiment, said at least one vent passes through thinned zones of the second substrate.

According to one possible embodiment of the method, the first substrate may be provided with a conducting portion passing through its thickness while the second substrate comprises another conducting portion in contact with a region on which the component will be located. This assembly between the first substrate and the second substrate may in this case be made so as to bring the conducting portion into contact with the other conducting portion.

The result is thus the formation of an electrical connection element passing through the substrate and connecting a first face of the support on which the component is located and a second face opposite the first face.

BRIEF DESCRIPTION OF THE DRAWINGS

This invention will be better understood after reading the following description of example embodiments given purely for information and in no way limitative, with reference to the appended drawings on which.

Identical, similar or equivalent parts of the different figures have the same numeric references to facilitate comparison between the different figures.

The different parts shown in the figures are not necessarily all at the same scale to make the figures more easily understandable.

Furthermore, in the following description, terms that depend on the orientation such as «under», «on», «above», «upper», «lower» etc. of a structure should be understood assuming that the structure is oriented as shown in the figures.

DETAILED DESCRIPTION OF PARTICULAR EMBODIMENTS

Figure 1A:
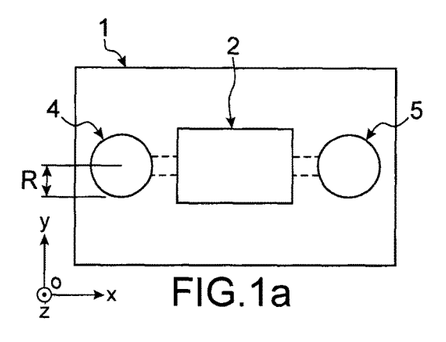
FIG. 1A shows a first example of a device comprising a fluid network located close to a component to be cooled and in which a liquid is circulated by actuation of deformable membranes.
Figure 1B:
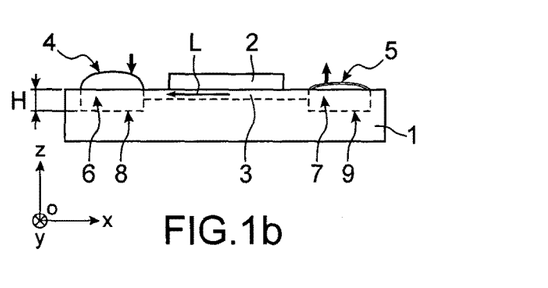
FIGS. 1B-1C show a particular example actuation of membranes so as to apply a to and fro movement on the cooling liquid in the fluid network.
Figure 1C:
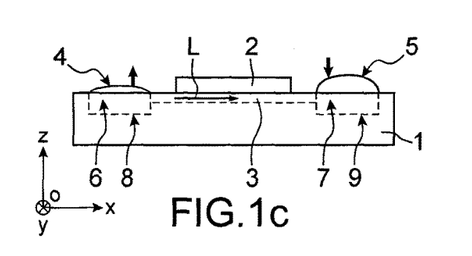

An example of a device provided with a fluid network suitable for cooling an electronic or electromechanical component is shown in FIGS. 1A-1B (FIG. 1A showing a top view while FIGS. 1B and 1C show a cross-sectional view of a first and second position of the device respectively).

The fluid network is formed in a support 1 on which a component 2 will be located. The support 1 may be in the form of a substrate, for example based on silicon.

The fluid network is located close to the component 2 and includes a channel 3 through which a liquid passes to cool the component. The channel 3 connects a first cavity 6 and a second cavity 7 between which the liquid can circulate. In the particular example in FIGS. 1A and 1B, a wall of the channel 3 is arranged under and in contact with the component 2 in order to provide better cooling. The channel 3 extends in one direction, called "main direction" between the first cavity 6 and the second cavity 7. The main direction of the channel is a direction taken parallel to the x-axis of an orthogonal reference [O; x; y; z] shown in some figures.

The cooling liquid is chosen so as to have good thermal conductivity and low viscosity. For example, it may be water or oil or glycol or even a metal in liquid form.

A mix of liquids may also be provided. The liquid may also comprise conducting particles, for example of the metal nanoparticles type, so as to improve heat exchanges between the component and the support.

Liquid circulation in the channel 3 is achieved by displacement of one or several deformable membranes 4, 5 attached to the support 1 and forming a mobile wall of the first cavity 6 and a mobile wall of the second cavity 7 respectively. The cavities 6, 7 are also provided with fixed walls 8, 9 formed in the support 1.

Deformation of the membranes 4, 5 and their displacement between several positions can thus alternately reduce or increase the volume of cavities 6, 7 in order to alternately tend to expel liquid from the cavities 6, 7 or draw liquid into them. Modulation of the volume of cavities 6, 7 can thus generate liquid displacements.

Actuation of membranes 4, 5 can be arranged such that the deformation applied to one membrane is different from the deformation applied to the other membrane.

In the particular example embodiment in FIG. 1, the membranes 4, 5 are in the form of a disk with a radius R for example between 1 and 10 mm. The height or depth H of the cavities 6, 7 may for example be between 50 and 500 µm.

FIGS. 1B and 1C show a particular actuation example of membranes 4, 5, in which the volume of the cavities 6 and 7 is varied alternately.

FIG. 1B shows a first position of the device in which the first cavity 6 has a given volume that may be maximum and corresponds to a first position of the first membrane 4, while the second cavity 7 has another volume that may be minimum and corresponds to a first position of the second membrane 5.

FIG. 1C shows a second position of the device, the first cavity 6 then having a minimum volume corresponding to a second position of the first membrane 4, while the second cavity 7 has a maximum volume corresponding to a second position of the second membrane 5.

Actuation means of membranes 4, 5 can thus be configured so that the device can be moved from the first to the second position and vice versa according to a predetermined sequence. The result is that a to and fro movement of liquid is created in the channel 3 in order to improve cooling of the component 2 located above it.

Figure 2:
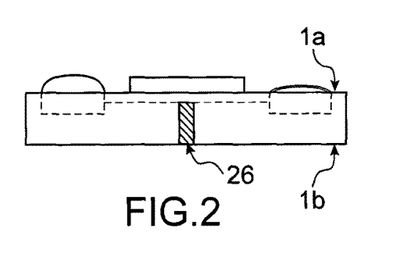
FIG. 2 shows an embodiment wherein a thermal conducting element is placed in contact with the fluid network to improve heat dissipation.

A variant embodiment of the device described above also includes a thermal conducting element 26 passing through the support 1 and arranged close to the fluid channel 3 or in contact with it. «Close to» in this case means that the element 26 is located at a distance of less than 100 µm from the channel. This facilitates heat dissipation to the outside when the liquid that is in channel 3 is heated due to heating of component 2.

In the example embodiment shown in FIG. 2, the thermal conducting element 26 extends from the channel 3 as far as face 1b of the support 1, called the «back face» in other words a face opposite the face called the «front face» and denoted 1a, on which the component 2 is located. The thermal conducting element 26 may be based on a material with a thermal conductivity higher than the thermal conductivity of the material from which the support 1 is made. The thermal conducting element 26 may be metallic, for example based on Cu, and may be made using a technology similar to that used for a TSV («Through Silicon Via») type electrical connection element.

The thermal conducting element 26 may be coated with a barrier layer to metal diffusion, for example made of titanium nitride. This barrier layer to diffusion may itself be coated with a layer of dielectric material for example such as $SiO_2$, particularly when the support 1 is based on a semiconductor or conductor.

The thermal conductive member 26 may also be coated and in contact with a thermal insulation layer. This will favour the diffusion of heat by the thermal conductive element 26 without loss on the sides. As an example, the thermal insulation layer may be $SiO_2$.

The device is not limited to a single thermal conducting element passing through the support 1 and it may include one or several additional thermal conducting elements, the dimensions and distribution of which are adapted as a function of an estimate of the position of heating points of the component 2.

The device is not limited to a fluid network provided with a single channel and two cavities. The device may be provided with n fluid channels (where n≥1) and m cavities (where m≥2) to form the fluid network.

In this case, a matrix layout of membranes or flexible walls may be made, some membranes possibly following different movement or deformation sequences relative to each other.

Figure 3A:
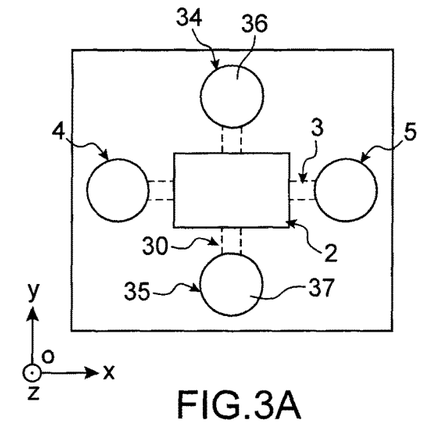
FIG. 3A shows a variant layout of the fluid network provided with one additional fluid channel facing the component.

Another example embodiment, shown in FIG. 3A, includes a fluid network provided with a plurality of fluid channels 3, 30 under the component 2, and particularly a second channel 30 comprising two additional cavities 36, 37 at its ends, between which a liquid will circulate. Displacement of membranes 34, 35 forming the mobile walls of these additional cavities located at the ends of the second channel 30 provides a means of moving a liquid in this second channel 30. The channels 3, 30 may be arranged to communicate with each other. The fluid network is not necessarily limited to two channels. On the layout of the fluid network in FIG. 3A, the channel 3 follows a first direction (the direction of the x axis in FIG. 3A) while the other channel 30 follows a second direction (the direction of the y axis in the orthogonal coordinate system [O; x; y; z] in FIG. 3A) different from the first direction and that may be orthogonal to the first direction.

Figure 3B:
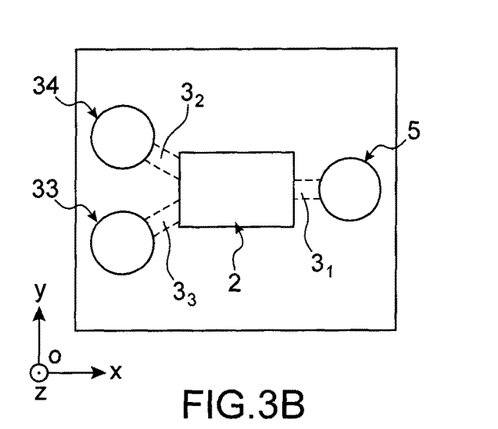
FIG. 3B shows a variant layout of the fluid network provided with two convergent channels connected to a third channel.

FIG. 3B shows another fluid network layout, with two first convergent channels $3_2$, $3_3$ connected through one end to a third channel $3_1$. The first two channels $3_2$, $3_3$ are each provided with another end, this other end opening up into a cavity. The cavities to which the channels $3_2$, $3_3$ are connected are advantageously similar in size to each other and membranes 34, 35 are installed on top of them. The third channel $3_1$ opens up in a cavity above which there is another membranes 5 and has a volume greater than or equal to the sum of the volumes of the cavities located at the ends of the channels $3_2$, $3_3$. The cross-section of the third channel $3_1$ is advantageously equal to the sum of the cross-sections of the first two channels $3_2$, $3_3$. In this case, the first two channels $3_2$, $3_3$ advantageously have the same cross-section. The deformable membranes 34, 35 may be actuated at the same time and they may have the same displacement or the same deformation so as to cause a to and fro movement of the liquid between the cavity with the largest volume and the other cavities with a smaller volume.

Figure 4:
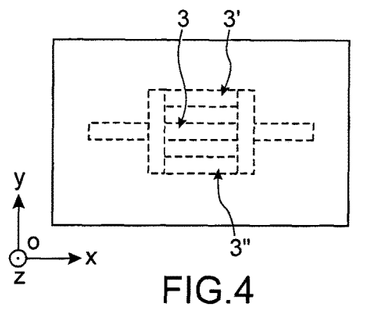
FIGS. 4 and 5 show variant layouts of fluid networks provided with several channels intersecting each other facing the component to be cooled.

FIG. 4 shows another example configuration of the cooling fluid network, with channels or segments of channels intersecting and communicating with each other. The channel 3 forms a main portion communicating with other secondary portions 3', 3" that may be parallel to each other and connected to this main portion through segments orthogonal to the main portion.

Figure 5:
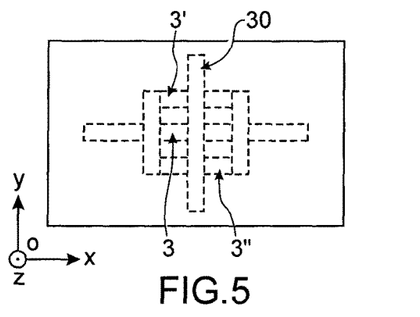

The variant embodiment in FIG. 5 further includes a channel 30 orthogonal to the main channel 3.

In order to limit head pressure drops in the fluid network, the channels 3, 3', 3" may be provided with a cross-section with a rounded shape, or possibly an ovoid or circular shape. The cross-section in this description refers to a cross-section taken parallel to the z axis in the orthogonal coordinate system in FIGS. 4 and 5 or orthogonal to the main plane of the support (the main plane of the support being a plane passing through the support and parallel to the [O; x; y] plane in FIG. 3). Pressure drops may further be limited at channel intersections by assuring that angles at intersections between the channels are less than 90°.

In each of the other example embodiments described above, the movement of the membranes 4, 5 forming the mobile walls of cavities 6, 7 from one position to the other position to enable expansion or contraction of the volume of these cavities 6, 7 and displacement of the liquid in the channel(s) of the fluid network, is controlled through actuation means.

Figure 6:
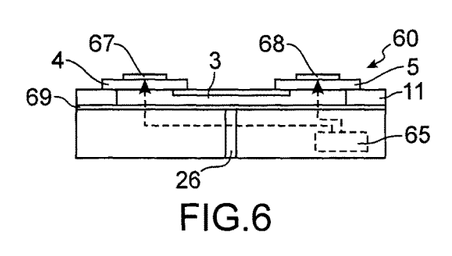
FIG. 6 shows an example embodiment of electrostatic actuation means of the mobile membranes.

FIG. 6 shows one example embodiment of the actuation means 60 of the electrostatic type. The liquid is moved in a channel 3 connecting cavities 6, 7 in this case by varying the electrostatic attraction forces applied on the membranes 4, 5.

The membranes 4, 5 are provided with separate electrodes 67, 68 for this purpose, facing a fixed electrode 69 integrated into the support 1.

An independent control of the mobile electrodes 67, 68 relative to each other may be provided to modulate the volume of the cavity 6, for example by increasing it, while modulating the volume of the cavity 7 differently, for example by reducing it. In this example embodiment, the electrodes 67, 68 are not connected to each other and they may be thus biased independently of each other. The result is that one membrane can be deformed while the other membrane is deformed in a different manner depending on the potentials applied to each of them.

The electrodes 67, 68 fixed to membranes 4, 5 are free to move and move towards or away from the fixed electrode 69 depending on the potential applied to them. In this example embodiment, the shape of a membrane 4, 5 is varied by modulating the attraction between a mobile membrane electrode 67, 68 and a fixed support electrode 69. The potentials applied to the electrodes may for example be of the order of ten volts.

The actuation means may include control means 65 configured to control the biasing of electrodes and adapted to place the electrodes 67, 68 in a biasing state in which at least one first electrode 67 is brought to a first potential V1, and at least one other electrode 68 is brought to a second potential V2, where V2≠V1. Thus, the electrodes 67, 68 may be controlled independently of each other by the biasing control means 65. The electrode biasing control means 65 may be in the form of a circuit comprising an addressing circuit of the electrodes 67, 68. The control means 65 in FIG. 6 are integrated into the support 1.

In the example embodiment shown in FIG. 6, the fixed electrode 69 is advantageously connected to the thermal conducting element 26 that then is also an electricity conducting element and can make a contact. The fixed electrode 69 may be a common electrode and arranged facing a set of several electrodes 67, 68.

In the particular example shown in FIG. 6 in which the electrode 69 acts as a common fixed electrode, it may also be used to facilitate assembly between an upper part of the device comprising the mobile electrodes 67, 68 and a lower part comprising the fixed electrode 69. This is the case, for example, when the electrode 69 is based on a metal such as Cu or Au and the assembly is made by metal/metal bonding, for example Copper to Copper or gold to gold. The distance between the mobile electrode 67 or 68 and the fixed electrode 69 may be such that the volume of the cavities 4, 5 may be varied by between 5 and 50%.

Actuation of the membranes 4, 5 by means of the control means 65 may be slaved to or triggered by temperature measurements made locally in component 2. Thus, the control means may be adapted to detect a signal showing a temperature rise of the component 2. Temperature measurement means, for example in the form of a built-in thermometer made from at least one transistor, may be integrated and may measure the temperature locally and control another logical circuit controlling the control means.

In the example in FIG. 6, the electrodes 67, 68 are arranged on the membranes 4, 5.

Figure 7:
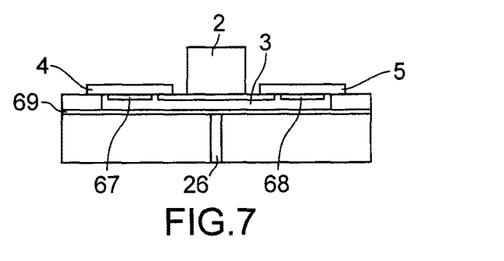
FIG. 7 shows a particular example configuration of electrostatic actuation means comprising electrodes located under the deformable membranes.

It would also be possible to position the electrodes 67, 68 under the membranes 4, 5, for example such that they are located in the cavities 6, 7 (FIG. 7). In this case, the mobile electrodes 67, 68 are brought closer to the fixed electrode 69 that makes it easier to actuate the electrodes with lower voltages.

The fixed electrode 69 may be in contact with the thermal conductive member 26, thereby making it possible to place the fixed electrode 69 at a given potential applied to the thermal conductive member 26, when the latter is also electrically conductive.

Figure 8:
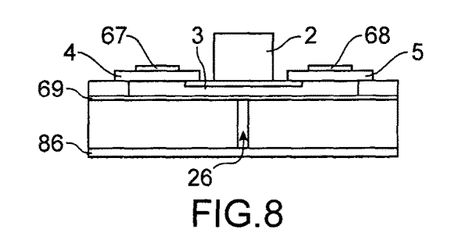
FIG. 8 shows a variant embodiment with an additional conducting zone to improve distribution of heat dissipation.

A variant embodiment shown in FIG. 8 shows that the conducting zone 86 may be integrated on the back face 1b of the support 1. This conducting zone 86 is connected to a thermal conducting element 26 passing through the support 1, that distributes heat on the back face 1b of the support 1. This conducting zone 86 may be made of metal, for example such as copper, and it may have a thickness of between several micrometers and several tens of micrometers. The conductive zone 86 may be intended to receive a radiator or heat sink structure in order to dissipate the heat conveyed by the thermal conductive element 26 and the conductive zone 86. The radiator or sink structure may be fixed e.g. by direct bonding or be formed by 3D printing.

Figure 9A:
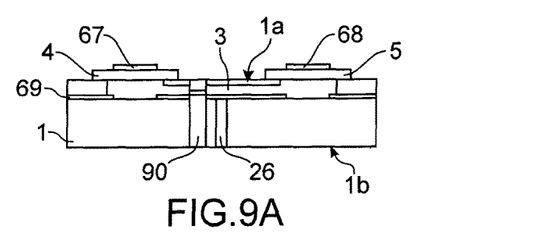
FIGS. 9A-9B show an example embodiment in which a connecting element is arranged to enable contact to be made on the component to be cooled.
Figure 9B:
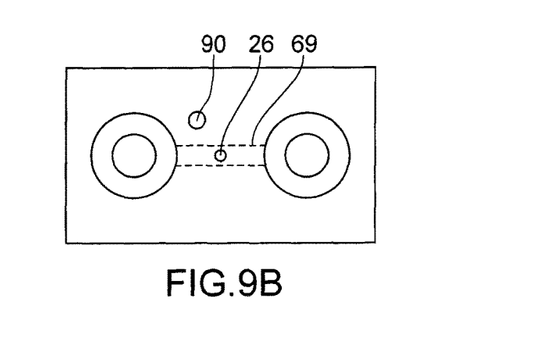

Another variant embodiment shown in FIGS. 9A-9B, includes a connecting element 90 configured to make electrical contact on the component 2 that is to be cooled. This connecting element 90 may be in the form of a via passing through the support 1 that extends between the front face 1a and the back face 1b of the support 1. It is thus possible to electrically connect the component 2 to be cooled through the back face of the support 1. The connecting element 90 may be arranged so as to pass through the support 1 without being in contact with the fixed electrode 69.

Figure 10:
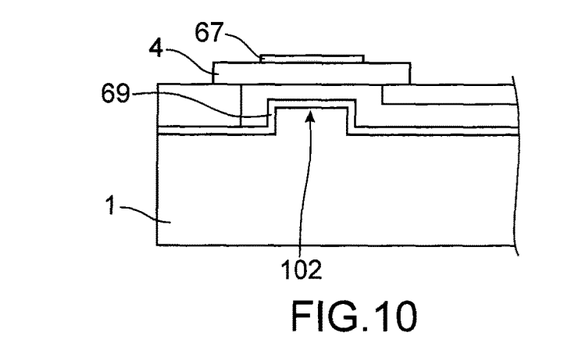
FIGS. 10 and 11A, 11B, 11C, 11D show various example configurations of actuation electrodes in the form of protuberance(s) to improve the deformation of membranes.

FIGS. 10 and 11 show different variant layouts of the fixed electrode 69 facing a membrane 4.

The support 1 may comprise a relief pattern 102 also called a «protuberance», that is arranged in a cavity 6 and on which the fixed electrode 69 is arranged. This can bring the mobile electrode 67 closer and provides better control over deformation of the membrane 4 on which the mobile electrode 67 is located (FIG. 10).

Figure 11A:
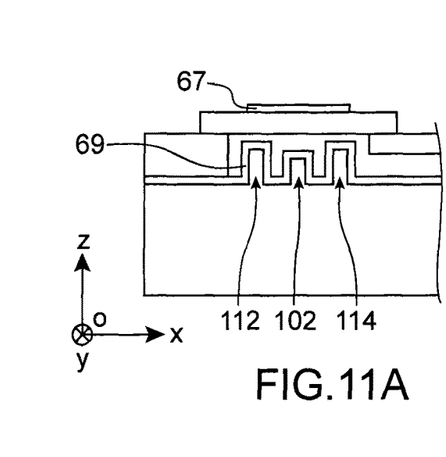

Several other protuberances 112, 114 may be provided with different heights, to facilitate deformation of the membrane and make it have a different profile. FIG. 11 shows a particular example embodiment in which the peripheral protuberances 112, 114 with height $H_2$ are formed around a central protuberance 102 with height $H_1$, where $H_1 < H_2$.

The geometries of the peripheral protuberances 112, 114 in a plane parallel to the main plane of the support 1 may be different. The addition of peripheral protuberances 102, 112, 114 can also reduce biasing voltages necessary to deform the membrane 4.

Figure 11B:
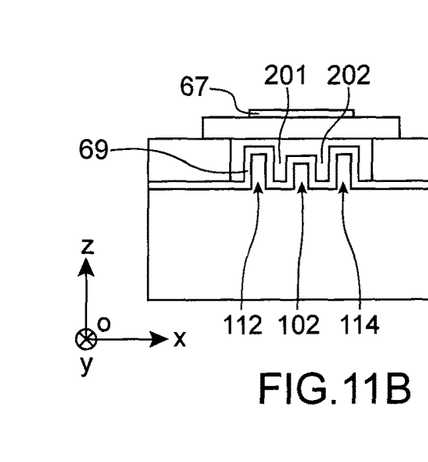

Another example of arrangement is given in FIG. 11B with grooves 201, 202 between the protuberances, the grooves 201, 202 also called "slots" are oriented parallel to the main direction of the channel 3 connecting the cavities 6 and 7 (i.e. parallel the vector x of reference [O; x, y, z]).

The fluid flowing between the cavities 6 and 7 is passed through the slots or grooves 201, 202.

Figure 11C:
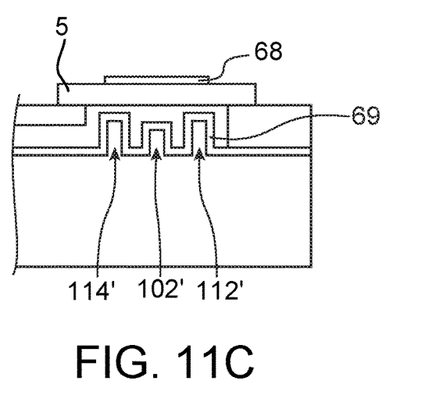
Figure 11D:
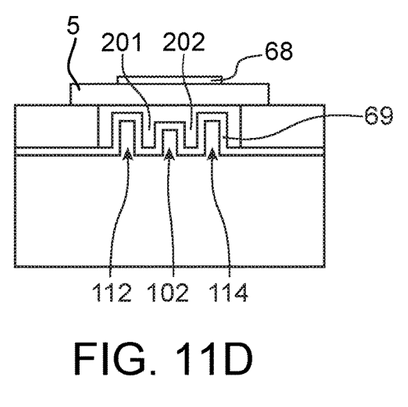

Similarly, FIGS. 11C and 11D show different variant layouts of the fixed electrode 69 facing a membrane 5 on which the mobile electrode 68 is located.

Figure 12:
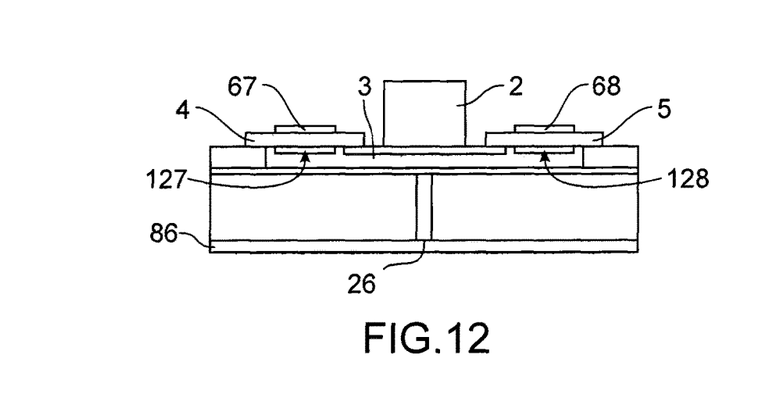
FIG. 12 shows an example embodiment of piezoelectric actuation means of deformable membranes.

Another example embodiment of the device with piezoelectric type actuation means is shown in FIG. 12. Membranes 4, 5 are provided with electrode pairs 67, 127 and 68, 128 respectively located on each side of a layer 125 or a stack comprising at least one sub-layer based on a piezoelectric material such as for example PZT (Lead Zirconate Titanium) so as to enable deformation of the membranes. The first membrane 4 is deformed by applying a first pair of potentials to electrodes 67, 127, while a second pair of potentials is applied to electrodes 68, 128, in order to deform the second membrane 5.

A fluid network device like that described above is suitable for cooling microelectronic devices or chips or microsystems that can release heat that has to be dissipated to assure that the components will work correctly and have a reasonable life. In particular, chips of integrated circuits made using a 3D technology can be cooled, in other words made with elements such as transistors, distributed on several levels of superposed semiconducting layers. A fluid network device like that described above may be compact along the z direction, so that it can be integrated into devices requiring a small dimension along z, for example such as portable telephones or tablets.

One example embodiment of a fluid network device like that described above will now be described with reference to FIGS. 13A-13F.

Figure 13A:
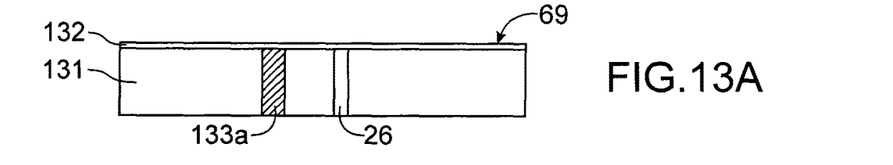
FIGS. 13A-13F show a first example of a method of making a fluid network device provided with membranes deformable by electrostatic actuation.

FIG. 13A shows a step of manufacturing a fixed electrode 69 by deposition of a metal layer 132 on a front face of a first substrate 131 that will form a lower part of support 1. The first substrate 131 may be semiconducting and for example based on Si. The metal layer 132 may be made of copper and its thickness may for example be of the order of one micron. When it is required to make a fixed electrode 69 covering one or several relief patterns or protuberances such as in the example in FIGS. 10, 11, the substrate 131 is formed before the metal deposit, for example by etching.

A thermal conducting element 26 that comes into contact with the metal layer 132, may be made by the formation of a hole passing through the first substrate 131. The hole may be made for example by photolithography and then for example by DRIE («Deep Reactive Ion Etching») type etching stopping on the metal layer 132. The width of the conducting element 26 may be between 10 and several hundred microns.

When this width is smaller, the substrate 131 could be thinned through its back face beforehand. The hole is then coated with an electrical insulating layer, for example based on $SiO_2$, and for example with a thickness of the order of several hundred nanometers.

A barrier layer to metal diffusion could then possibly be deposited in the hole. This barrier layer may be for example based on TiN, and its thickness may for example be several tens of nanometers. These insulating barrier layers are then etched at the bottom of the hole before the hole is filled with a metal material.

The metal filling material may for example be copper. Filling may be done by physical vapour deposition (PVD) or for example by chemical vapour deposition (CVD), and then by electro-chemical deposition.

As a variant, the thermal conducting element 26 may be made before the fixed electrode 69 is formed.

A lower conducting portion 133a of the connecting element 90 as shown in the FIGS. 9A-9B can also be made during the formation of the thermal conducting element 26. This portion 133a can thus be made at the same time as the element 26 by the formation of a hole in the substrate 131 then filling of the hole with the metal material.

Figure 13B:
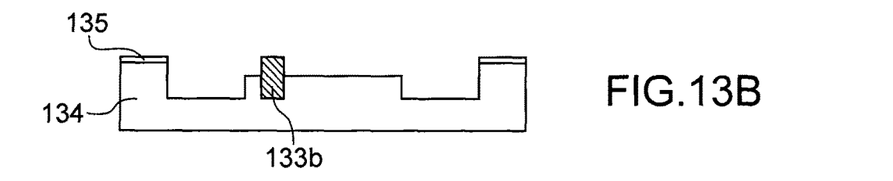

In order to make an upper part of the support 1 on which the membranes 4, 5 and mobile electrodes 67, 68 will be fixed, a second substrate 134 may be provided on which metal zones 135 are formed (FIG. 13B). The metal zones 135 may for example be based on copper and their thickness may for example be of the order of one micron. These metal zones 135 are designed to allow assembly between the two substrates 131 and 134. In the case in which the planned assembly method is direct bonding, and particularly copper to copper bonding, a surface preparation of the zones 135 and the surface of the layer 132 may be made by chemical-mechanical polishing (CMP).

An upper conducting portion 133b of a connecting element 90 (like that shown in FIGS. 9A-9B) may also be made in the second substrate 134. This upper conducting portion 133b is formed in contact with a region of the second substrate on which a component to be cooled will be placed.

In the second substrate 134, a fluid network is then formed comprising at least one channel and cavities at the ends of the channel.

Figure 13C:
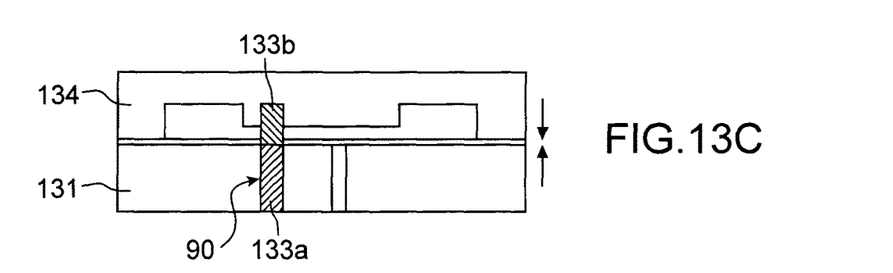

The next step is to assemble a first substrate 131 and a second substrate 134 (FIG. 13C).

The assembly may be made according to a direct bonding method, advantageously metal/metal (Cu/Cu or Au/Au) or by fuse brazing using a eutectic alloy for example such as AuSn (with a melting temperature of the order of 280° C.), or for example based on AuSi (with a melting temperature of the order of 363° C.) or AlGe (with a melting temperature of the order of 419° C.). Direct oxide/oxide ($SiO_2/SiO_2$) bonding is possible as a variant.

The assembly between the two substrates 131, 134 is designed so that a support provided with a sealed fluid network is formed. During this step, assembly of the lower conducting portion 133a made in the first substrate 131 and the upper conducting portion 133b made in the second substrate 134 may also be made by direct bonding so as to form the connecting element 90.

Figure 13D:
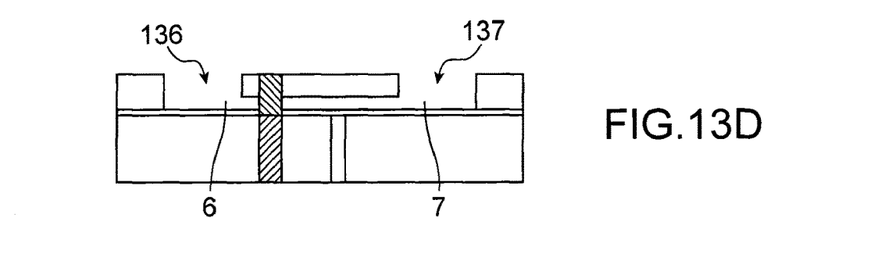

The next step is to thin the back face of the second substrate 134, in order to make openings 136, 137 exposing cavities 6, 7 respectively (FIG. 13D).

Figure 13E:
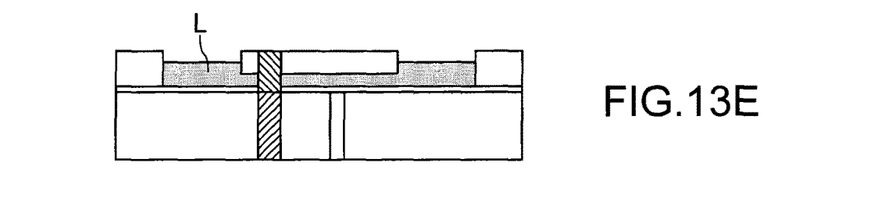

The next step is to fill the cavities and channels by dispensing an appropriate liquid L through the openings 136, 137 (FIG. 13E). The liquid L may for example be dispensed by inkjet.

The next step is to close the cavities 6, 7 by forming the membranes 4, 5. This is done by rolling a film 138 that can be flexible, for example based on a photosensitive resin or Polyethylene Terephthalate (PET), or silicone. This film 138 is suitable for bonding to the second substrate 134 and it may be etched so as to form several distinct membranes. It would also be possible to make a prior glue deposit for example a UV setting glue on the second substrate 134 to enable bonding of the flexible film 138. In this case, the film 138 is bonded onto the substrate 134 by the glue setting after the film 138 has been transferred onto the substrate 134. The film 138 may be between several microns and several hundred microns thick.

Figure 13F:
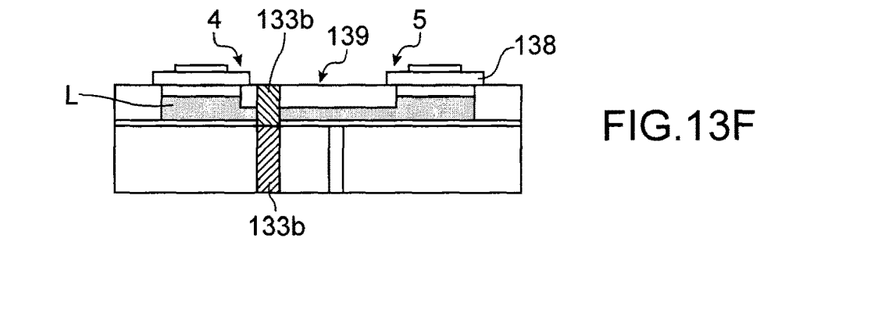

The next step is to deposit mobile electrode patterns by photolithography and etching. The metal deposit may be preceded firstly by a bonding layer to the metal material. The bonding layer may for example be based on Cr or Ti and it may be several tens of nm thick. The metal electrode material may for example be copper, with a thickness of between several ten and several hundred nm (FIG. 13F).

The next step may be to assemble a component on a region 139 of the second substrate 134 located between the membranes 4, 5, and exposing a connecting element 90 formed by bonding of conducting portions 133a and 133b.

As a variant of the previously described method, when it is required to make a device like that shown in FIG. 7 with electrodes located under the membranes, these electrodes are formed on the film 138 before the film is transferred on the support.

Figure 14A:
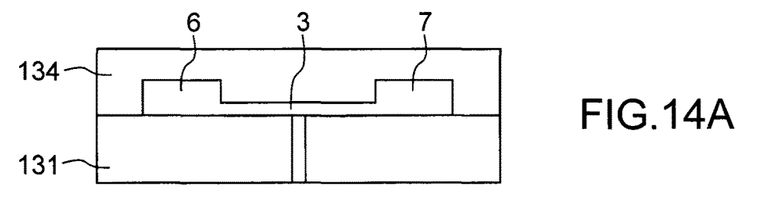
FIGS. 14A-14C show a second example of a method of making a fluid network device with piezoelectric actuation.
Figure 14B:
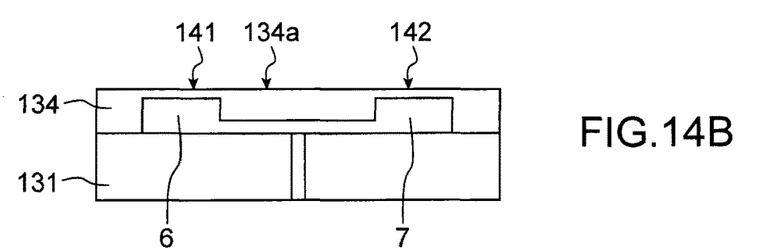
Figure 14C:
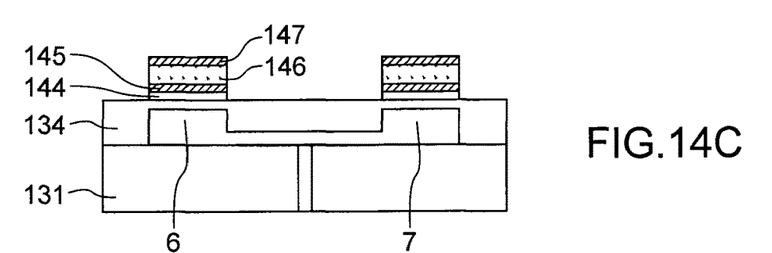

Another variant method for the use of a piezoelectric actuation device, is shown in FIGS. 14A-14C.

In this example, the steps in a method such as that described previously with reference to FIGS. 13A-13C may be performed, except for formation of a fixed 3 0 electrode 69 that is not compulsory in this case. The result is that two substrates 131, 134 are assembled to form a support in which a fluid channel 3 and cavities 6, 7 are provided (FIG. 14A).

Then (FIG. 14B), the back face 134a of the second substrate 134 is thinned so as to keep a thickness for example of the order of several microns. The membranes are formed from thinned zones 141, 142 of the second substrate 134 and located facing cavities 6, 7.

Zones based on the insulating material 144 are then formed on thinned zones 141, 142. An electrical insulating material 144 for example such as $SiO_2$, for example several hundred nm thick to several micrometers thick, may be deposited for this purpose and shaped by photolithography and etching.

The next step is to form lower electrodes on zones made from the insulating material 144. This is done by using deposition and then formation steps of a layer based on a metal material 145, for example such as platinum or ruthenium and, for example with a thickness of the order of several hundred nanometers.

Zones made from piezoelectric material 146 are then formed on the lower electrodes. This is done by deposition and formation steps of a layer of piezoelectric material 146. The piezoelectric material 146 may for example be based on PZT and its thickness may be between several micrometers and several tens of micrometers.

The next step is to form upper electrodes on zones of piezoelectric material 146 (FIG. 14C). This may be done by depositing and forming a layer based on a metal material 147 for example such as gold and for example with a thickness of the order of several hundred nanometers.

Figure 15A:
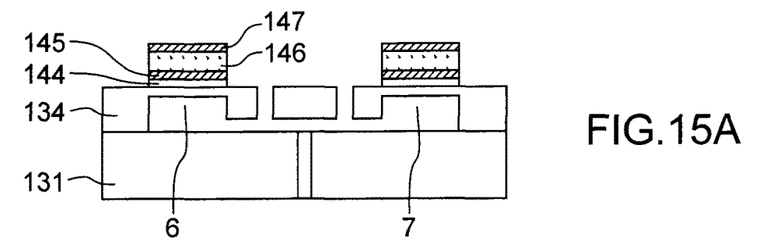
FIGS. 15A-15B show a first example of a method of filling the fluid network.
Figure 15B:
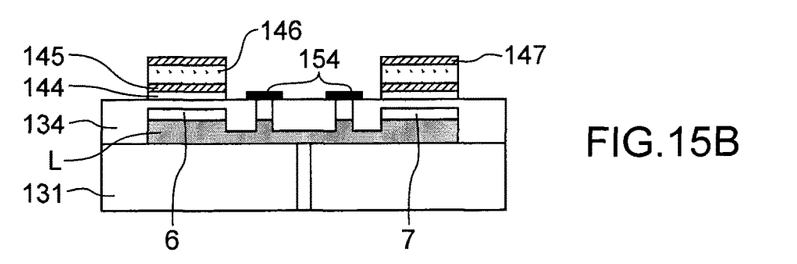

A first example method of filling the fluid network is shown in FIGS. 15A-15B.

Filling may then be done by dispensing through one or several holes or vents 151, 152 formed in the support and advantageously placed around the periphery of membranes 4, 5, the vents 151, 152 opening up into the fluid channel 3 (FIG. 15A).

In this case, the vents 151, 152 are closed after the fluid network has been filled with a liquid L. This may be done for example by rolling a layer of flexible material 154, for example based on PET, or a silicone layer (FIG. 15B).

Figure 16A:
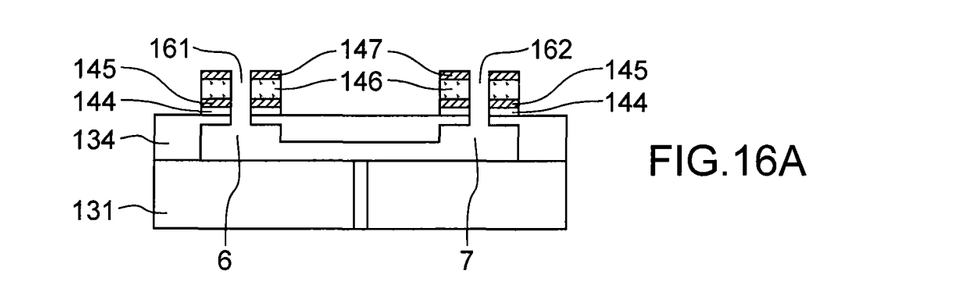
FIGS. 16A-16C show a second example of a method of filling the fluid network.
Figure 16B:
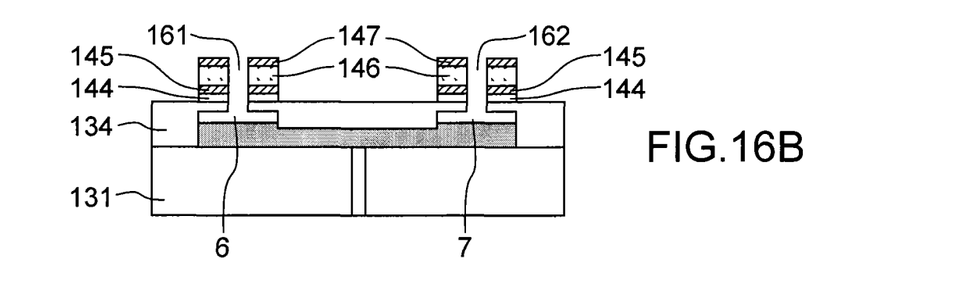

As a variant of the method described above, holes or vents 161, 162 may be made in the membranes, for example by drilling (FIG. 16A). This drilling may be done after having formed the lower electrodes, the piezoelectric material layer 146 and the upper electrodes. In this case, an appropriate design will be chosen for the electrodes, for example perforations in the part common to the lower and upper electrodes. The fluid circuit is then filled with a liquid L dispensed using vents 161, 162 (FIG. 16B).

Figure 16C:
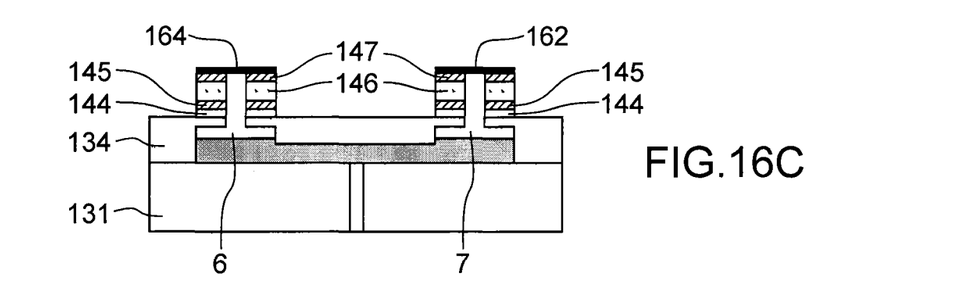

The vents 161, 162 are then closed off by means of a film 164. The film 164 may be formed by rolling and be based on polymer (FIG. 16C).

Figure 17A:
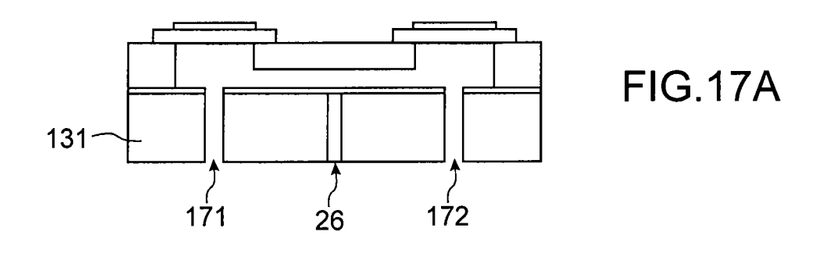
FIGS. 17A-17C show a third example of a method of filling the fluid network.

As a third variant of the two manufacturing methods described above, vents 171, 172 are made through the back face of the substrate 131 (FIG. 17A). It is possible to take advantage of the step described above to make the thermal conductor 26 passing through the thickness of the substrate to excavate vents 171, 172. Thus, the vents 171, 172 can be made in the same etching step as the step in which a hole is made in which the heat conductor 26 is housed.

Figure 17B:
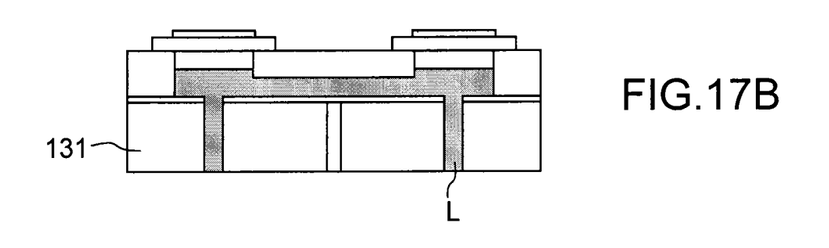
Figure 17C:
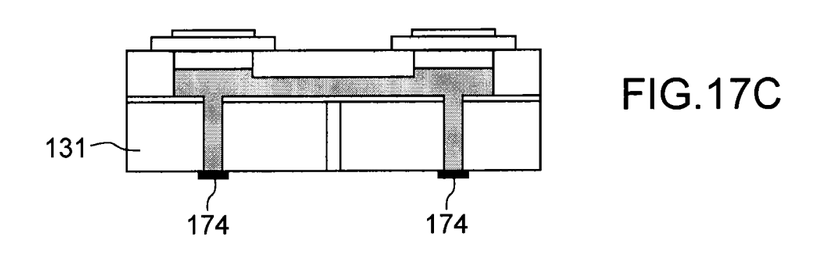

Then, after the fluid network has been filled with liquid L through vents 171, 172 (FIG. 17B), the vents 171, 172 are closed off for example by rolling a layer of flexible material 174 (FIG. 17C) as described in the previous two variants.

The invention claimed is:

1. A device for cooling a component comprising:
   a support that will receive on a first face the component to be cooled, the support comprising a fluid network inside which a liquid will circulate, the fluid network comprising a first cavity, a second cavity, a first channel connecting the first cavity to the second cavity, and a first deformable membrane and a second deformable membrane forming a mobile wall of the first cavity and a mobile wall of the second cavity, respectively; and
   an actuating device for actuating the first membrane and the second membrane, configured to enable deformation of at least one of the first or the second membrane so as to vary a volume of at least one of the first cavity or the second cavity and to enable displacement of the liquid in the first channel,
   wherein the actuating device comprises:
      a first electrode located on the first membrane,
      a second electrode located on the second membrane, and
      a fixed electrode located on the support and facing the first electrode in the first cavity or facing the second electrode in the second cavity or facing both the first electrode and the second electrode,
   wherein the fixed electrode is located on protuberances of the support, said protuberances facing the first electrode or the second electrode or both the second and the first electrode, and
   wherein a first protuberance among said protuberances is arranged in between a second protuberance and a third protuberance among said protuberances, said third protuberance and second protuberance both having a height that is greater than a height of said first protuberance, said first protuberance and second protuberance being separated by a first groove, said first protuberance and third protuberance being separated by a second groove, said first groove and second groove extending in a direction parallel to the first channel, and each of said first protuberance, second protuberance and third protuberance facing said first electrode.

2. The device according to claim 1, wherein the actuating device is configured to alternately:
   displace the first membrane so as to reduce the volume of the first cavity, then
   displace the second membrane so as to reduce the volume of the second cavity.

3. The device according to claim 2, wherein the actuating device is configured to:
   jointly with displacement of the first membrane so as to reduce the volume of the first cavity, displace the second membrane so as to increase the volume of the second cavity, then
   jointly with displacement of the second membrane so as to reduce the volume of the second cavity, displace the first membrane of the first cavity so as to increase the volume of the first cavity.

4. The device according to claim 1, wherein the first membrane or the second membrane comprises a layer of piezoelectric material.

5. The device according to claim 1, wherein the actuating device comprises biasing means for biasing the first electrode and the second electrode, the biasing means being integrated into the support.

6. The device according to claim 1, wherein the actuating device comprises biasing means capable of applying a first potential to the first electrode and a second potential to the second electrode, different from the first potential.

7. The device according to claim 1, wherein a thermal conducting element is connected to a heat conducting zone located on a second face of the support.

8. The device according to claim 1, further comprising an electrical connection element passing through the support and connecting the first face of the support on which the component is to be located and a second face opposite the first face.

9. The device according to claim 1, comprising m number of cavities, where m is greater than or equal to 2, and n number of channels, where n is greater than or equal to 1, so as to form a fluid network connecting all the cavities together.

10. The device according to claim 1, further comprising means for measuring a temperature of the component and a control means for controlling the actuating device as a function of the temperature measured by the measurement means.

11. The device according to claim 1, further comprising a thermal conducting element close to the first channel or in contact with the first channel, the thermal conducting element passing through the support from the first channel or close to the first channel towards a second face of the support opposite said first face, the thermal conducting element having a thermal conductivity higher than a thermal conductivity of the support.

12. A method of manufacturing a device according to claim 1, comprising:
   assembling a first substrate with a second substrate, said first channel and openings designed to form at least one of the first cavity or the second cavity being at least partially made in at least one of the first substrate or the second substrate; and
   closing the openings by at least one of forming membranes from one or several thinned zones of the second substrate or transferring at least one layer on the second substrate.

13. The method according to claim 12, further comprising filling said first channel and the first and second cavities by a liquid, said filling being conducted before the openings are closed by the membranes.

14. The method according to claim 12, further comprising filling said first channel and the first and second cavities after the openings have been closed by the membranes, the filling including:
   forming a vent in the second substrate or the first substrate such that said vent opens up in said first channel, filling said first channel and the first and second cavities with a liquid dispensed through said vent, and depositing a film to close off said vent.

15. The method according to claim 14, wherein said vent passes through thinned zones of the second substrate.

16. The method according to claim 12, wherein the first substrate is provided with a first electrically conducting portion passing through a thickness of the first substrate, and the second substrate comprises a second electrically conducting portion in contact with a region on which the component will be located, the assembling of the first substrate with the second substrate being performed so as to bring the first conducting portion into electrical contact with the second conducting portion.

17. The method according to claim 12, wherein the assembling between the first substrate and the second substrate is done by direct metal/metal bonding.

* * * * *